(12) United States Patent
Lin et al.

(10) Patent No.: US 9,613,679 B2
(45) Date of Patent: *Apr. 4, 2017

(54) CONTROLLED DYNAMIC DE-ALIGNMENT OF CLOCKS

(71) Applicant: Cavium, Inc., San Jose, CA (US)

(72) Inventors: David Da-Wei Lin, Westborough, MA (US); Edward Wade Thoenes, Cambridge, MA (US)

(73) Assignee: Cavium, Inc., San Jose, CA (US)

( * ) Notice: Subject to any disclaimer, the term of this patent is extended or adjusted under 35 U.S.C. 154(b) by 106 days.

This patent is subject to a terminal disclaimer.

(21) Appl. No.: 14/542,188

(22) Filed: Nov. 14, 2014

(65) Prior Publication Data

US 2016/0141017 A1    May 19, 2016

(51) Int. Cl.
| | |
|---|---|
| *G06F 1/04* | (2006.01) |
| *G11C 11/4076* | (2006.01) |
| *G11C 11/406* | (2006.01) |
| *H03L 7/081* | (2006.01) |
| *G11C 7/10* | (2006.01) |
| *G11C 7/22* | (2006.01) |

(52) U.S. Cl.
CPC ........ *G11C 11/4076* (2013.01); *G11C 11/406* (2013.01); *H03L 7/0818* (2013.01); *G11C 7/1093* (2013.01); *G11C 7/222* (2013.01); *G11C 2207/2254* (2013.01)

(58) Field of Classification Search
CPC ................ G11C 11/406; G11C 11/4076
USPC ...................................................... 713/500
See application file for complete search history.

(56) References Cited

U.S. PATENT DOCUMENTS

| | | | | |
|---|---|---|---|---|
| 7,111,184 B2* | 9/2006 | Thomas, Jr. | ............... | G06F 1/12 375/362 |
| 2003/0034814 A1* | 2/2003 | Chen | ......................... | H03L 7/10 327/158 |
| 2004/0027157 A1* | 2/2004 | Hirota | ..................... | H03K 5/133 326/66 |
| 2004/0027166 A1* | 2/2004 | Mangum | .................... | G06F 1/12 326/93 |
| 2005/0088214 A1* | 4/2005 | Morrison | .............. | H03L 7/0814 327/233 |
| 2005/0131670 A1* | 6/2005 | Wang | ................... | G06F 17/5027 703/23 |
| 2009/0302910 A1* | 12/2009 | Maeda | ...................... | H03K 5/13 327/161 |
| 2010/0007383 A1* | 1/2010 | Harrison | ............... | G11C 7/1072 327/3 |
| 2010/0237914 A1* | 9/2010 | Katoh | ........................ | G06F 1/10 327/149 |
| 2011/0148498 A1* | 6/2011 | Mosalikanti | ........... | H03H 17/08 327/243 |
| 2011/0248755 A1* | 10/2011 | Hasenplaugh | .......... | H03L 7/087 327/157 |

(Continued)

*Primary Examiner* — Vincent Tran
(74) *Attorney, Agent, or Firm* — Occhiuti & Rohlicek LLP

(57) ABSTRACT

A controller includes first and second functional units, first and second clock-signal sources that provide corresponding first and second clock signals that drive the first and second functional units respectively. The second clock-signal generates its second clock-signal based on the first clock-signal. The clock-retardation unit dynamically causes the second clock-signal to have a target time-domain offset relative to the first clock-signal.

22 Claims, 4 Drawing Sheets

(56) References Cited

U.S. PATENT DOCUMENTS

| | | | |
|---|---|---|---|
| 2012/0126869 A1* | 5/2012 | Payne | H03L 7/0812 327/161 |
| 2012/0206181 A1 | 8/2012 | Lin et al. | |
| 2012/0319749 A1* | 12/2012 | Thaller | H03L 7/183 327/158 |
| 2013/0343441 A1* | 12/2013 | Alfieri | H04L 7/02 375/224 |
| 2014/0133613 A1* | 5/2014 | Kumar | H03L 7/00 375/354 |
| 2015/0207620 A1* | 7/2015 | Colby | H04L 7/0331 375/376 |

\* cited by examiner

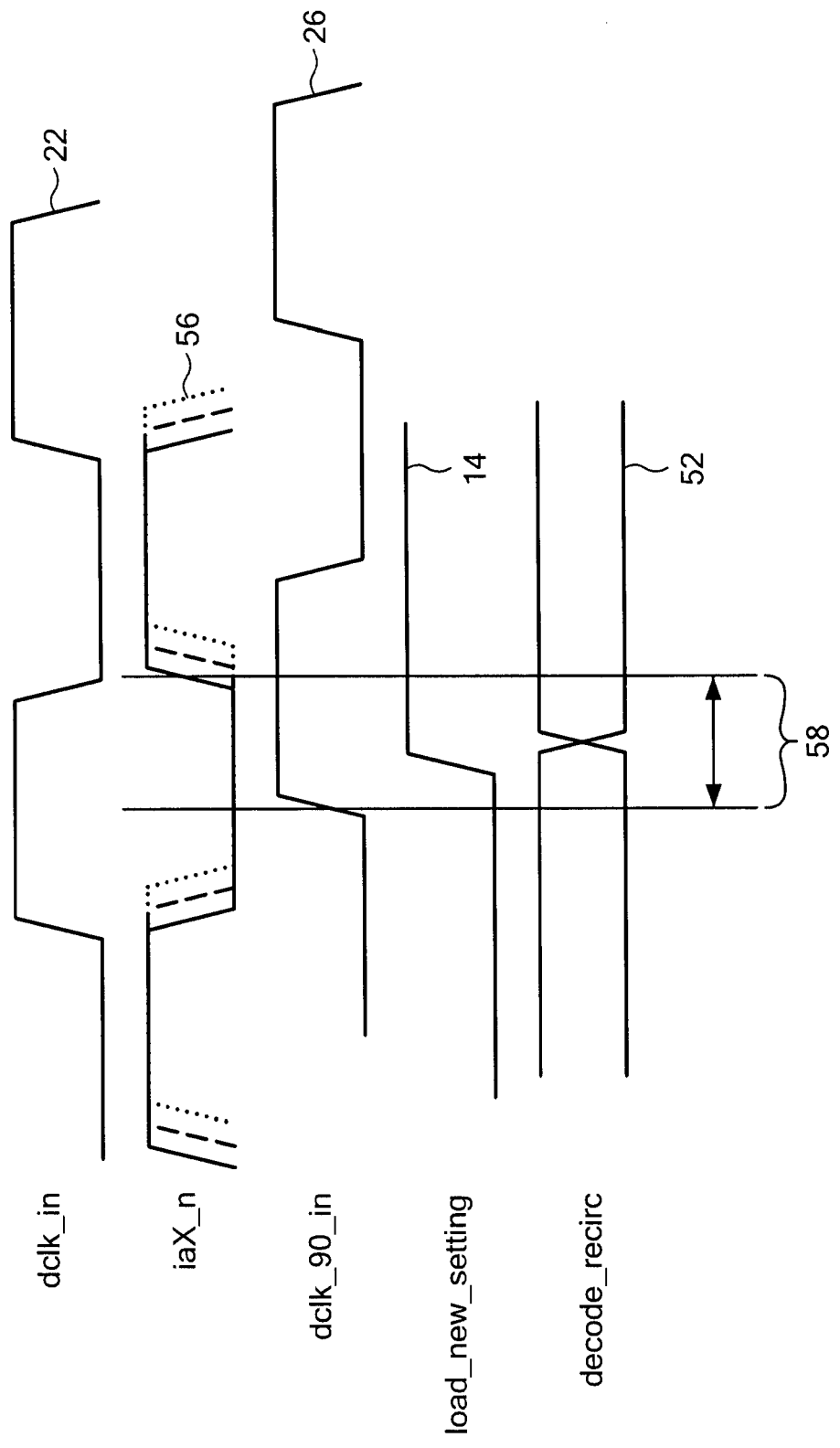

CONTROLLED DYNAMIC DE-ALIGNMENT OF CLOCKS

BACKGROUND

This application relates to systems in which functional units that rely on different clock signals communicate with each other, and in particular, in systems in which a relationship between those clock signals must be maintained.

Many systems have functional units that are driven by different clocks. These functional units are said to be in different clock domains.

In many cases, it is useful to maintain a fixed relationship between the clocks in the different clock domains. In particular, it is useful for these clock signals to be temporally offset from each other. This temporal offset results in a phase difference between clock signals. For example, if there are four functional units in four clock domains, the phases of the four clock signals are 0, 90, 180, and 270 degrees. Thus, each clock signal is at least 90 degrees in phase away from any other clock signal.

Such temporal offsetting of clock signals is useful because it tends to equalize the load on the power supply. In addition, the offsets result in lower simultaneous switching noise.

A difficulty that arises is that of maintaining these phase differences over time. In general, environmental factors, such as heat or voltage fluctuation can cause these phase differences to change somewhat unpredictably. This can lead to errors in those portions of the data processing system that receive multiple clock signals, such as the memory controller.

SUMMARY

The techniques described herein provide a way to dynamically adjust the temporal offset and hence the resulting phase offset, for example, by periodically obtaining the correct delay-line output to achieve the target offset, and incrementally adjusting the delay line over the course of one or more adjusting steps.

In one aspect, the invention features a method for controlling operation of a system that extends across two or more clock domains and that comprises a plurality of functional units in different clock domains. The method includes driving a first functional unit with a first clock-signal, driving a second functional unit with a second clock-signal that has a first phase-offset relative to the first clock-signal, receiving reference information indicative of an amount of phase delay applied to the first clock-signal, defining a target phase-offset between the first and second clock-signals. A phase discrepancy is given by a difference between the target phase-offset and the first phase-offset. The method further includes, based on the reference information, causing a phase difference between the first clock-signal and the second clock-signal to take a step toward the target phase-offset. Within a first range of phase discrepancies, the step has a first step-size that is independent of phase discrepancy within the first range.

In one practice, the first step-size has a first value common to all phase discrepancies within the first range of phase-discrepancies, and the first step-size is smaller than any value of phase discrepancy in the first range of phase discrepancies.

In another practice, the first step-size is inadequate to reach the target phase-offset.

Other practices are those in which causing a phase difference between the first clock-signal and the second clock-signal to take a step toward the target phase-offset occurs during a first period from a first set of first periods. In these practices, each first period from the set of first periods is between a first second-period and a second second-period from a set of second periods, and each second period from the set of second periods is between a first first-period and a second first-period from the set of first periods.

Among these practices are those in which, during first periods from the set of first periods, the system is quiescent. In some practices, these first periods consist of memory-refresh intervals.

Other practices include selecting the system to be a memory sub-system, in which case the functional units are memory-interfaces. Among these are practices in which the memory sub-system is a dynamic random access memory.

In some practices, an adjustment step is repeated. For example, in some practices, causing a phase difference between the first clock-signal and the second clock-signal to take a step toward the target phase-offset occurs multiple times, each of which takes place during a first period from a first set of first periods. Each of these first periods from the set of first periods is between a first second-period and a second second-periods from a set of second periods, and each second period from the set of second periods is between a first first-period and a second first-period from the set of first periods.

In some practices, receiving reference information indicative of an amount of phase delay applied to the first clock-signal comprises receiving information indicative of a phase difference that is caused by a first delay line having delay-line output. In these practices, causing a phase difference between the first clock-signal and the second clock-signal to take a step toward the target phase-offset comprises changing a delay-line setting from which the second clock-signal is obtained based on inspection of characteristics of a second delay line. Among these practices are those in which causing a phase difference between the first clock-signal and the second clock-signal to take a step toward the target phase-offset comprises causing the delay-line setting to be changed upon detection of a window of opportunity during which the second clock-signal is in a stable state.

In another practice, causing a phase difference between the first clock-signal and the second clock-signal to take a step toward the target phase-offset comprises providing a first signal that identifies a range of phase offsets to be applied to the first clock signal and providing a second signal that selects a phase offset from the range of phase offsets.

In some practices, within a second range of phase discrepancies, the step has a second step-size that is independent of phase discrepancy within the second range.

Other practices include those in which the first step-size is selected to avoid causing a glitch in the second clock-signal, and those in which the first step-size is selected to avoid causing cycle compression in the second clock-signal to an extent that reduces margin by more than a specified value.

In another aspect, the invention features a method for controlling operation of a system that extends across plural clock domains, with the system having first and second functional units in different clock domains. Such a method includes driving the first functional unit with a first clock-signal, driving the second functional unit with a second clock-signal that has a first temporal offset relative to the first clock-signal, and dynamically adjusting a temporal offset between the first clock-signal and the second clock-signal.

Practices include those in which dynamically adjusting the temporal offset between the first clock-signal and the second clock-signal is repeated repetition during each of a plurality of clock-adjustment intervals, as well as those in which dynamically adjusting the temporal offset between the first clock-signal and the second clock-signal is completed through repetition during each of a plurality of clock-retardation intervals. Among these are practices in which, after each repetition, a non-zero difference remains between the temporal offset and a target temporal offset.

In other practices, dynamically adjusting a temporal offset between the first clock-signal and the second clock-signal to cause a reduction in a difference between the first phase-offset and a target phase-offset comprises causing a reduction that fails to reach the target phase-offset.

In other practices, dynamically adjusting a phase difference between the first clock-signal and the second clock-signal to cause a reduction in a difference between the first phase-offset comprises adjusting by an amount that is insufficient to cause a glitch in the second clock-signal.

In yet other practices, dynamically adjusting a phase difference between the first clock-signal and the second clock-signal to cause a reduction in a difference between the first phase-offset comprises adjusting by an amount that is insufficient to cause cycle compression in the second clock signal that compresses a margin beyond a specified value.

In another aspect, the invention features an apparatus for data processing. Such an apparatus includes first and second functional units, first and second clock-signal sources, and a clock-retardation unit. The first clock-signal source provides a first clock-signal that drives the first functional unit. The second clock-signal source provides a second clock-signal that drives the second functional unit. This second clock-signal is based on the first clock-signal. The clock-retardation unit is configured to dynamically cause the second clock-signal to have a target time-domain offset relative to the first clock-signal.

In some embodiments, the second clock-signal source comprises a second-clock-signal-source delay line.

In other embodiments, the clock-retardation unit is configured to identify a target phase offset between the first and second clock signals and to cause the delay line to retard the first clock-signal by less than a difference between a target phase offset and an actual phase offset between the first and second clock signals.

Other embodiments include those in which the clock retardation unit is configured to repeatedly cause the delay line to retard the first clock-signal by selected amounts. These selected amounts are each less than a difference between the target time-domain offset between the first and second clock signals and an actual time-domain offset between the first and second clock-signals.

Embodiments include those in which the clock retardation unit is configured to detect occurrence of a clock-retardation interval between two operating intervals and to cause clock retardation only during the clock-retardation interval, and those in which the clock-retardation unit is configured to detect occurrence of a memory refresh interval between two operating intervals and to cause clock retardation only during the clock-retardation interval.

In other embodiments, the first functional unit comprises a delay-locked loop. The clock-retardation unit is configured to retrieve information from the delay-locked loop, and to use the information retrieved from the delay-locked loop to control the second clock-signal source. Among these are embodiments in which the delay-locked loop comprises a first clock signal source delay line that is identical to the second clock signal source delay line.

Additional embodiments include a first decoder and a first recirculator. The first decoder is configured for receiving a first delay-line setting from the clock-retardation unit and to generate a one-hot multiplexer select therefrom. The first recirculator is configured to buffer the multiplexer select, thereby preventing the multiplexer select from being applied to the delay line. In some of these embodiments, the second delay-line setting is a function of the first delay-line setting. Also among these embodiments are those that further include a second decoder and a second recirculator. The second decoder is configured for receiving a second delay-line setting from the clock-retardation unit, and to generate a second multiplexer select from the second delay-line setting. The second recirculator is configured to buffer the second multiplexer select, thereby preventing the second multiplexer select from being applied to the delay line.

Also among the embodiments are those that include a third recirculator that receives the delay-line setting from the clock-retardation unit and buffers the delay-line setting so that it is not immediately applied to the delay line. In these embodiments, the delay-line setting is a fine-control signal. Some of these embodiments further include a phase interpolator that is configured to apply a time-domain offset to the first clock-signal based on the first and second delay-line settings and on the fine-control setting.

Other embodiments include a synchronizer configured to load the multiplexer select and fine-control setting into storage in response to detection of a first signal and a second signal. The first signal indicates a window of opportunity for dynamically adjusting the phase difference, and the second signal is a update signal indicative of a presence of the delay-line setting in front of the recirculator.

In another aspect, the invention features a data-processing apparatus having means for generating a first clock-signal, means for generating a second clock-signal having a dynamically adjustable phase difference relative to the first clock-signal, and means for dynamically adjusting the phase difference in response to changes in environmental conditions.

In some embodiments, the means for dynamically adjusting the phase difference comprises means for causing a temporal offset that is inadequate to reach a target temporal offset.

In another aspect, the invention features an apparatus for data processing. Such an apparatus includes a first functional unit, a second functional unit, a first clock-signal source, a second clock-signal source, and a clock-retardation unit. The first clock-signal source provides a first clock-signal and the second clock-signal source provides a second clock-signal based on the first clock-signal. The first and second clock-signals drive the first and second functional units respectively. The clock-retardation unit is configured to dynamically cause the second clock-signal to sustain a temporal offset that causes an offset between the first and second clock-signals to step toward a target time-domain offset between the first and second clock-signals.

In some embodiments, the clock-retardation unit is configured to cause the second clock-signal to sustain a temporal offset that is independent of a difference between the target time-domain offset and the offset between the first and second clock signals.

In other embodiments, the clock-retardation unit is configured to dynamically cause the second clock-signal to sustain a temporal offset that causes an offset between the first and second clock-signals to step toward a target time-domain offset between the first and second clock-signals. This temporal offset has a step-size that is less than a magnitude of a difference between the target time-domain offset and the offset between the first and second clock signals.

In yet other embodiments, retardation unit is configured to receive reference information indicative of an extent of the temporal offset.

Additional embodiments include those in which clock-retardation unit is configured to cause the second clock signal to sustain the temporal offset during a first period from a set of interleaved first and second periods. Among these are embodiments in which the first periods are periods during which the system is quiescent. Also among these are embodiments in which the first periods consist of memory-refresh intervals.

In other embodiments, the clock retardation unit is configured to cause the second clock-signal to sustain the temporal offset multiple times, each of which takes place during a first period from a set of interleaved first and second periods.

Embodiments also include those have first and second delay lines, both of which are connected to the clock-retardation unit. In these embodiments, the clock-retardation unit is configured to control the second delay line based at least in part on information concerning operation of the first delay line. Among these embodiments are those in which the clock-retardation unit is configured to cause the second clock-signal to sustain a temporal offset that causes an offset between the first and second clock-signals to step toward a target time-domain offset between the first and second clock-signals by changing a delay-line setting of the second delay-line upon detection of a window of opportunity during which the second clock-signal is in a stable state. Also among these embodiments are those in which the clock-retardation unit is configured to cause the second clock-signal to sustain a temporal offset that causes an offset between the first and second clock-signals to step toward a target time-domain offset between the first and second clock-signals by providing a first signal and a second signal to the second delay line. In these embodiments, the first signal identifies a range of offsets, and the second signal selects an offset within the range of offsets.

Some embodiments include a delay-line connected to the clock-retardation unit. In these embodiments, the clock-retardation unit is configured to send first and second signals to the delay-line. The first signal indicates a delay-line setting to be applied to the delay line. This delay-line setting is applied to the delay line at least in part based on the second signal.

Further embodiments include those in which the clock-retardation unit is configured to cause the second clock-signal to sustain a temporal offset that has an extent that is selected to avoid causing a glitch in the second clock-signal, and also those in which the clock-retardation unit is configured to cause the second clock-signal to sustain a temporal offset that has an extent that is selected to avoid causing cycle compression in the second clock-signal to an extent that reduces margin by more than a specified value.

These and other features of the invention will be apparent from the following description and the accompanying drawings.

BRIEF DESCRIPTION OF THE DRAWINGS

FIG. 4 shows timing of various signals shown in FIG. 3.

DETAILED DESCRIPTION

Figure 1:
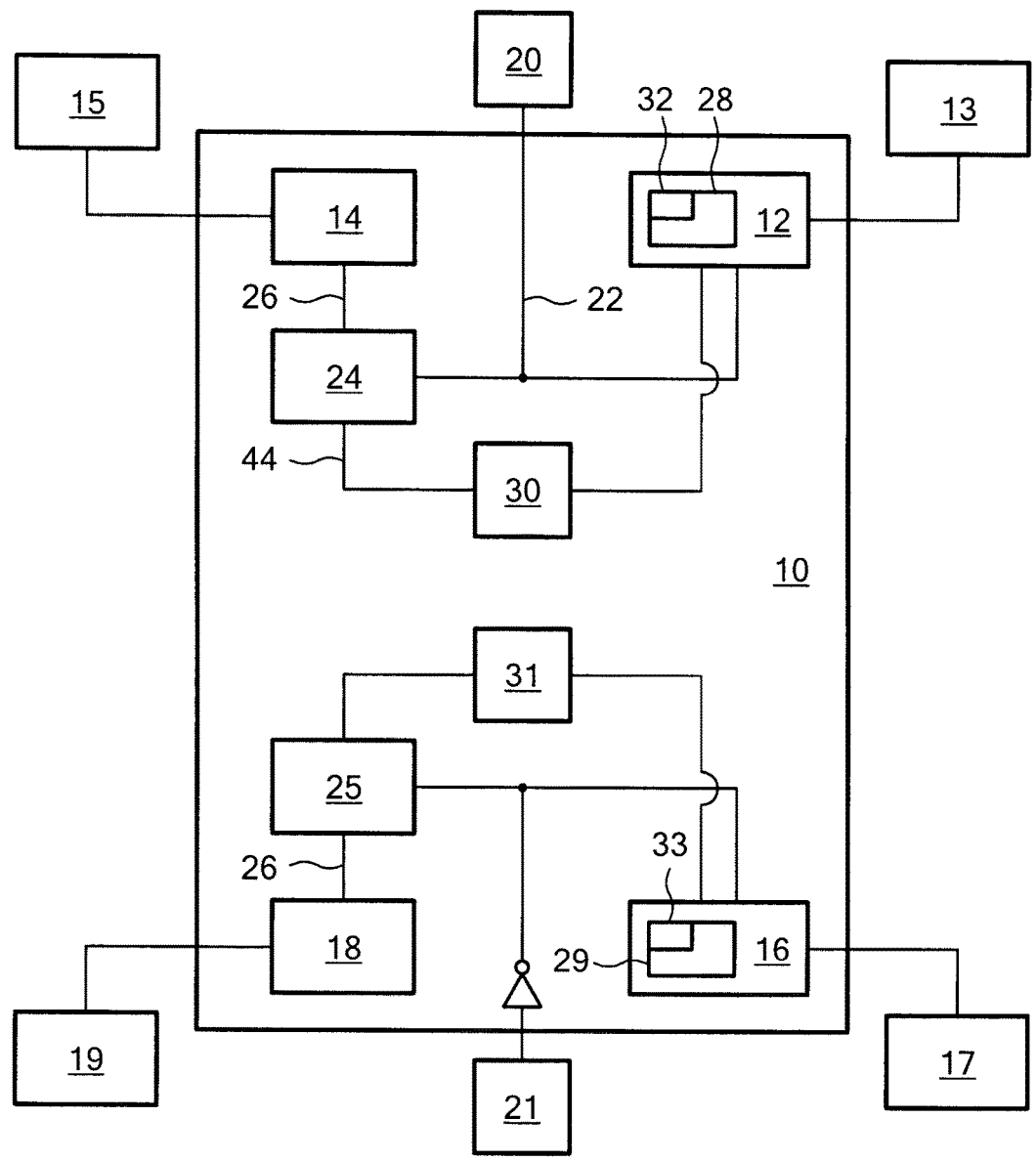
FIG. 1 shows a memory controller that relies on multiple shifted clock signals.

FIG. 1 shows a memory controller 10 having four memory interfaces 12, 14, 16, 18, each of which manages a set of memory modules 13, 15, 17, 19 for a computing device. In an alternative implementation, there are four memory controllers, each of which has one memory interface. However, in either case, the interfaces will receive clock signals that are offset from each other as described below.

In an alternative embodiment, a memory sub-system has four memory controllers, each of which manages one memory interface. In such an implementation, first and second memory controllers would control the corresponding first and second interfaces 12, 14, while second and third memory controllers would control the corresponding third and fourth interfaces 16, 18. All four memory controllers would be in different clock domains. However, the first and second memory controllers and the third and fourth memory controllers would be in communication with each other.

The memory controller 10 may be included within an integrated circuit that includes other functional units (not shown) as part of a single or multi-core processor, or a system on chip, for example. Each of the memory modules 13, 15, 17, 19 can include, for example, one or more dual in-line memory modules, each of which includes a set of dynamic random access memory chips.

The techniques described herein can be understood by considering only the first and second memory interfaces 12, 14. The third and fourth memory interfaces 16, 18 have analogous structure and operation based on controller circuitry analogous to the circuitry used for controlling the first and second memory interfaces 12, 14.

In particular, a first clock retardation unit 30 is used for dynamically retarding a clock-signal that has been obtained from a first phase-locked loop 20, as described in more detail below, and a second clock-retardation unit 31 is used for dynamic retardation of a clock-signal based on a second phase-locked loop 21. Other embodiments can include circuitry that is arranged differently for handling any number of memory interfaces. For example, in some embodiments, a single clock-retardation unit combines the functions of the first and second clock-retardation units 30 and 31. In other embodiments a single phase-locked loop provides the clock source for two separated clock-retardation units.

The first phase-locked loop 20 provides a first clock-signal 22 that directly feeds the first memory interface 12. This same first clock-signal 22 feeds an input of a first delay-line 24. The output of the first delay-line 24 is a second clock-signal 26 that feeds the second memory interface 14. This second clock-signal 26 is a retarded version of the first clock-signal 22.

One goal of the memory controller 10 is to maintain control over the extent of the retardation applied to the first clock-signal 22 to obtain the second clock-signal 26 so as to obtain a constant temporal offset between the first clock-signal 22 and the second clock-signal 26 notwithstanding changing environmental circumstances. In particular, an overall goal for the configuration shown in FIG. 1 is to delay (or "retard") the first clock-signal 22 by a pre-determined amount in both the time domain and in phase space to generate the second clock-signal 26. In general, the predetermined amount in phase space is given by 360/N degrees, where N is the number of clock signals. The predetermined amount in the time domain is given by the ratio of the clock period to the number of clock signals. For the illustrated embodiment, with four memory interfaces, the preferred phase difference is ninety degrees and the preferred temporal offset is a quarter of the period of the first clock-signal 22.

The first delay-line 24 has nodes that connect to corresponding intermediate delay stages $u_1, u_2, \ldots u_N$. These nodes are multiplexed to an output of the first delay-line 24. Each such node yields a retarded version of the first clock-signal 22. The extent of this retardation monotonically increases with the index $1, 2, \ldots N$ of the delay stages. One of these stages is selected to produce an output that becomes the second clock-signal 26. The memory controller 10 identifies the particular delay stages $u_1, u_2, \ldots u_N$ of the first delay-line 24 that retards the first clock-signal 22 by the target amount, and chooses that as the source of the output of the first delay-line 24. Unfortunately, as a result of temperature and voltage variation, the retardation associated with each delay stage $U_1, u_2, \ldots u_N$, will change with time. This means that the particular stage $u_1, u_2, \ldots u_N$ of the first delay-line 24 that retards the first clock-signal 22 by a quarter period of the clock signal may need to be changed accordingly.

Suppose that at first, a $k^{th}$ stage $u_k$ is chosen as a target retardation to the first clock-signal 22. In this case, the second clock-signal 26 is obtained by deriving the delay from $u_k$. But eventually, as a result of drift caused by environmental factors, $u_k$ may no longer be applicable as the target retardation. Instead, it is $u_{k+n}$ that does so. In that case, to maintain the same phase shift, there must be a way to cause the second clock-signal 26 to come from $u_{k+n}$ instead of $u_k$.

The first memory interface 12 has one or more delay-locked loops and one of the delay-locked loops 28 that is used for providing a phase delay with respect to the first clock-signal 22 for use within the first memory interface 12. The delay-locked loop 28 comprises a second delay-line 32 that is identical to the first delay-line 24, but is included within a feedback loop to ensure that it provides a precise phase delay that tracks along temperature and voltage changes. In some embodiments, the precise phase delay is ninety degrees. However, the precise phase delay can be any value from which it is possible to control the first delay-line 24 so as to obtain a desired second clock-signal 26. As a result of its proximity to the first-delay line 24, the second delay-line 32 is in roughly the same thermal environment and has endured similar process variation as the first delay-line 24. As a result, the retardations associated with outputs of the second delay-line 32 should be comparable to the retardations of corresponding outputs of the first delay-line 24.

A clock-retardation unit 30 communicates with both the delay-locked loop 28 and the first delay-line 24. This clock-retardation unit 30 is configured to interrogate the delay-locked loop 28 to determine which feedback-controlled output of the second delay-line 32 results in a target retardation. The clock-retardation unit 30 is further configured to change that delay stage of the first delay-line 24 if necessary based on the information obtained as a result of having interrogated the delay-locked loop 28.

In an alternative embodiment, the delay line 24 is a delay locked loop that would have a continuous but rate-limited update to ensure that the phase delay is only slowly adjusted, thus avoiding cycle compression and glitches. This allows the second clock 26 to maintain the desired phase offset from clock 22 without the need for updated delay settings from delay locked loop 28 that need to be passed by the clock-retardation unit 30. Such an embodiment offers the elimination of the clock-retardation unit 30. However, a delay locked loop consumes more than twice the chip area and power consumption of a delay line.

Operation of the memory controller 10 is divided into alternating first and second periods. During the first period, the clock-retardation unit 30 carries out tasks associated with clock-signal retardation and phase adjustment. In some embodiments, the first period is one in which the memory modules 13, 15, 17, 19 are quiescent, and therefore not in use for retrieving and storing data. Selecting the first period in this way reduces the risk of any data errors occurring as a result of changing the output of the first delay-line 24 that is used to create the second clock-signal 26.

In some embodiments, this safeguard is not necessary. In such embodiments, the clock-retardation unit 30 will carry out its function anytime. In these embodiments, the likelihood of data errors can be reduced by ensuring that the change in temporal or phase offset is small enough to avoid the likelihood of glitches, or excessive cycle compression in the second clock-signal 26.

As used herein, "cycle compression" refers to reducing the cycle time between the rising edge of an $n^{th}$ cycle and a rising edge of an $(n+1)^{th}$ cycle. If this cycle time is reduced too much, the timing margin available for computation between two consecutive cycles is removed and could lead to setup time violation.

As used herein, a "glitch" refers to the formation of an extra pulse in the gap between a rising edge of an $n^{th}$ pulse and a rising edge of an $(n+1)^{th}$ pulse. Glitching tends to increase the number of pulses. Both cycle compression and glitching can lead to transaction errors.

In some embodiments, the memory modules 13, 15, 17, 19 include dynamic random access memories. In these embodiments, the first period coincides with the refresh period of the memory modules 13, 15, 17, 19. When carried out during the refresh period, changing the delay stage of the first delay-line 24 that is used to create the second clock-signal 26 is less likely to interfere with the normal operation of the memory modules 13, 15, 17, 19.

Figure 2:
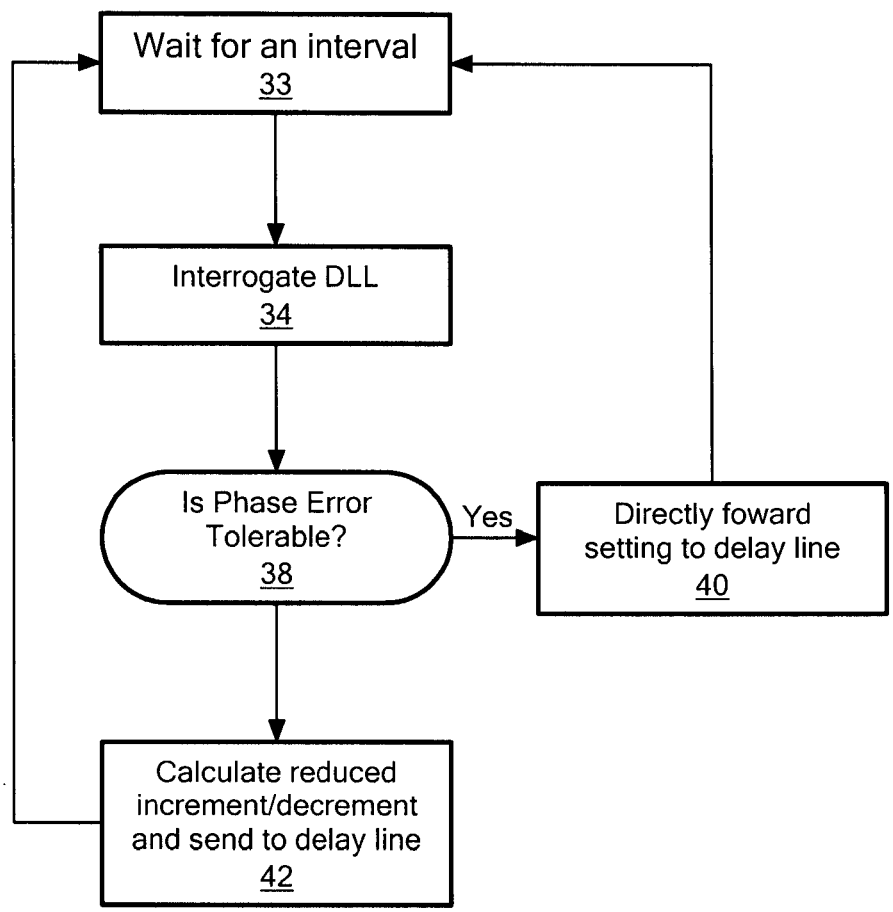
FIG. 2 shows a phase-shift correction method carried out by the memory controller of FIG. 1.

FIG. 2 shows an example of the general procedure carried out by the clock-retardation unit 30 at the beginning of a clock-retardation period.

The clock-retardation unit 30 first waits (step 33) for a clock-adjustment interval after its last action to ensure that successive updates are not too frequent to cause cycle compression or glitches. The clock-retardation unit 30 then interrogates the delay-locked loop 28 and determines that the $k^{th}$ stage of the second delay-line 32 is currently yielding a target value of retardation (step 34). Since the clock-retardation unit 30 originally provided the delay-line 24 with the $n^{th}$ stage as the delay line setting, the clock-retardation unit 30 determines whether these delay stages are close enough to each other so that the phase error can be safely updated without causing cycle compression or a glitch (step 38). This can be viewed as evaluating whether $|n-k|<\tau$ for some threshold $\tau$.

If the delay variances are not too far away, in other words, if the delay stage difference is smaller than threshold $\tau$, the clock-retardation unit 30 directly forwards the delay setting it obtains from the delay-lock loop 28 and subsequently sends an update signal 44 and a delay-settings signal 45 to the first delay-line 24 to change the selected delay stage in the direction of the correct output (step 40). The delay-settings signal 45 carries information indicative of how much delay should be applied, while the update signal 44 is sent to trigger application of the delay setting 45. Details on the function of these signals will be discussed in connection with FIG. 3.

If the delay variances are greater than the threshold τ, the clock-retardation unit 30 must calculate a new delay line setting 45 that is within a limited increment or decrement size from the previous delay setting 45 of the delay line 24 (step 42). In general, it is not prudent to jump from the n$^{th}$ stage to the k$^{th}$ stage if |n−k| is too large. Instead, the clock-retardation unit 30 causes the first delay-line to step up or down by no more than a programmable step size. As a result, the clock-retardation unit 30 will not necessarily cause the first delay-line 24 to output a second clock-signal 26 with the target retardation at the first periodic update. However, in the long run, over the course of several clock-retardation periods, the second clock-signal 26 will come close to having the target retardation. By taking smaller steps in the appropriate direction, and spreading those steps across multiple clock-retardation periods, the clock-retardation unit 30 avoids glitches or cycle compression in the second clock-signal 26. Since the rate of temperature and voltage change are one or more orders of magnitude slower than the update period of the delay line 24, the multiple step approach will eventually reach the desired setting from the delay locked loop 28. After having forwarded a delay-line setting to the delay line (step 40 or step 42), the clock-retardation unit 30 returns to the wait state 33 and starts the cycle over again.

Figure 3:
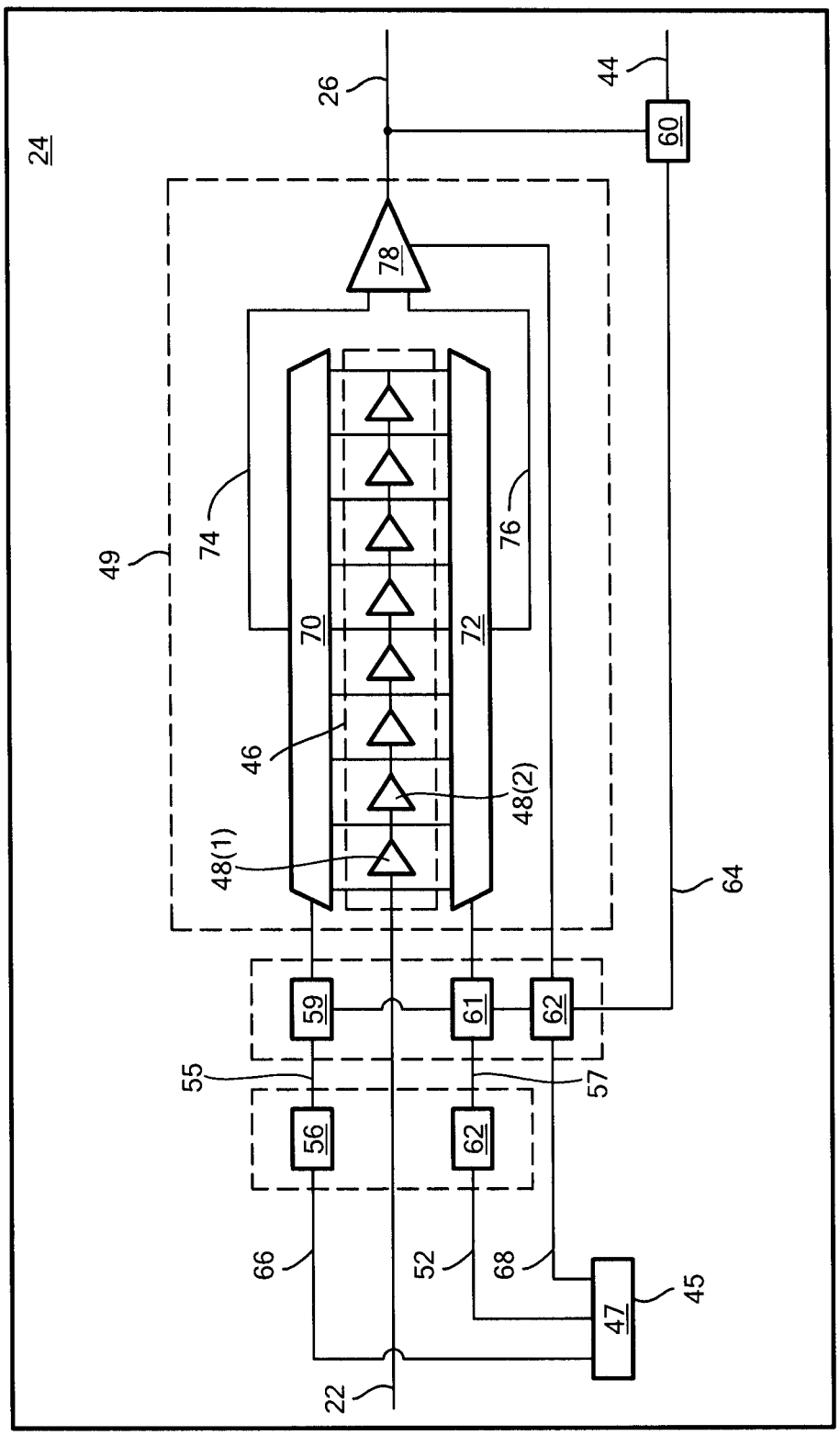
FIG. 3 shows details of a delay line in the memory controller of FIG. 1.

Referring to FIG. 3, an example of the first delay-line 24 includes a buffer chain 46 made up of a plurality of buffers 48(1) . . . 48(N) with the input of one buffer 48(n+1) being connected to the output of the preceding buffer 48(n). The output of a buffer 48(n) corresponds to the delay-line stage $u_n$. The first clock-signal 22 enters the buffer chain 46 and traverses it. In the course of traversing the buffer chain 46, the first clock-signal 22 is retarded by an amount that depends on how many of the buffers 48(n) it traverses.

Although the illustrated delay line uses buffers, this is only one of many ways to implement the function of a delay line. In other embodiments, the buffers may be replaced by any circuit element that provides a unit delay while preserving the timing and digital logic levels of a signal.

As discussed above, the delay-settings signal 45 carries information indicative of how much delay should be applied. This information consists of three parts: a first delay-line setting 66, a second delay-line setting 52, and a fine-adjustment setting 68. The first and second delay-line settings 66, 52 identify adjacent buffers 48(i), 48(i+1) from which first and second candidate clock signals 74, 76 will be obtained. These first and second clock signals 74, 76 will bracket the phase delay applied to the first clock-signal 22 in order to generate the second clock-signal 26. Thus, if the first delay-line setting 52 identifies a first buffer 48(i) that causes a first delay, and the second delay-line setting 52 identifies a second buffer 48(i+1) that causes a second delay, then the delay that will ultimately be applied to the first clock-signal 22 will be somewhere in the closed interval bounded by the first and second delays. In general, the second delay-line setting 52 is simply the first delay-line setting 66 incremented by one. As a result, the buffers identified by the first and second delay-line settings 66, 52 will always be adjacent.

Thus far, it should be apparent that the delay-line signal has not yet identified a delay. It has only identified a range of delays. To actually identify a delay, it is necessary to identify an offset within this range. This is the purpose of the third component of the delay-settings signal 45, namely the fine adjustment setting 68. The fine adjustment setting 68 identifies precisely where in the closed interval bounded by the first and second delays the delay to be applied to the first clock-signal 22 will actually be. In particular, the fine-adjustment setting 68 controls the phase interpolator 78 to provide a clock signal 26 with a delay that is between the delays specified by the first and second buffers 48(n), 48(n+1).

In the particular implementation shown in FIG. 3, which is a ping-pong delay line, the delay-line settings signal 45 is divided into most significant bits and least significant bits. The most significant bits encode the first and second delay-line settings 66, 52. The least significant bits encode the fine adjustment settings 68.

The first and second delay-line settings 66, 52 are provided to corresponding first and second decoders 51, 53. The decoders 51, 53 decode the first and second delay-line settings into corresponding first and second one-hot signals 55, 57. The first one-hot signal 55 is provided to a first multiplexer 70 to cause the first multiplexer to output a first candidate clock signal 74 that is taken from an output of a first selected buffer 48(i). The second one-hot signal 57 is provided to a second multiplexer 72 to cause the second multiplexer 72 to output a second candidate clock signal 76 that is taken from an output of a second selected buffer 48(i+1) that is adjacent to the first selected buffer 48(i).

The one-hot signals 55, 57 are not, however, applied immediately. They are blocked by corresponding first and second recirculators 59, 61 where they await their storage and release at an opportune moment by a load signal 64 under circumstances described in connection with FIG. 4.

Meanwhile, the fine adjustment setting 68 is provided directly to a third recirculator 62, from which it too awaits release by the load signal 64.

The load signal 64 initiates operation by taking 55, 57, 68 into three recirculators 59, 61, 62. Immediately after capturing 55, 57, 68, the first one-hot signal 55 reaches the first multiplexer 70 and selects the first candidate second-clock-signal 74. Meanwhile, the second one-hot signal 57 reaches the second multiplexer 72 and selects the second candidate-clock-signal 76. The first and second candidate second-clock-signals 74, 76 are provided to a phase interpolator 78.

The phase interpolator 78 outputs the second clock signal 26 with a time-domain offset that is within a range defined by the first and second candidate-clock-signals 74, 76 inclusive. In effect, the phase interpolator 78 assigns relative weights to the first and second candidate-clock-signals 74, 76. These relative weights identify a point within the range. The fine adjustment setting 68, which has been released from the third recirculator 62, is what identifies the particular weight.

The delay-setting signal 45 can thus be viewed as arming the recirculators with desired settings that are determined by the clock-retardation unit 30 based on information obtained from the delay-locked loop 28. Once armed, they are ready to be released. However, releasing them at any random time may result in cycle compression or glitching. It is therefore important to identify the opportune moment for release, and to implement a mechanism to achieve release at that moment.

FIG. 4 illustrates the preferred timing of various signals found in FIG. 3. The figure shows the first clock-signal 22 and the second clock-signal 26, which, as a result of having passed through the first delay-line 24, is offset relative to the first clock-signal 22.

In the process of making the second clock-signal 26, there are various signals 56 internal to the first delay-line 24 that represents internal delay stages across the buffer chain. For a brief window of opportunity 58, however, these various signals 56, the first clock-signal 22, and the second clock-signal 26 are not transitioning. This window of opportunity 58 would be the best time to store and apply the delay-line settings 52, 66 as well as the fine adjustment setting 68, in the corresponding recirculators 54. As is apparent from FIG. 4, the start of the window of opportunity 58 coincides with the rising edge of the second clock-signal 26.

To ensure that the one-hot signals derived from various settings 52, 66, and fine adjustment settings, 68 are applied and stored only when the window of opportunity 58 has actually begun, the second clock-signal 26 is connected to a synchronizer 60 that also receives an update signal 44 from the clock-retardation unit 30. The output of the synchronizer 60 connects back to the recirculators 59, 61, 62. A load signal 64 at the output of the synchronizer 60 can thus trigger storage and release of the first and second one-hot signals 55, 57 and the fine-adjustment setting 68 from the recirculators 59, 61, 62 shortly after the window of opportunity 58 begins.

In operation, the clock-retardation unit 30 sends the update signal 44 to the first delay-line 24, and in particular to the synchronizer 60. As soon as the synchronizer 60 receives the second clock signal 26 from the phase interpolator 78, the synchronizer 60 issues its load signal 64. This load signal 64 then travels back to the recirculators 59, 61, 62. Upon reaching the recirculators 59, 61, 62, the load signal causes the first and second one-hot signals 55, 57 and the fine adjustment setting 68, to be stored into the corresponding recirculators 54 and released into the delay-line assembly 49 where they are applied to the first and second multiplexers 70, 72. The fact that the synchronizer 60 causes this action only when the second clock-signal 26 has reached it ensures that the release into the delay-line assembly 49 can only occur only during the window of opportunity 58.

FIG. 4 shows the results of the timing achieved by the synchronizer 60. Upon receiving the rising edge of the second clock-signal 26, the synchronizer 60 outputs a load signal 64. This immediately releases the signals blocked by the recirculators 59, 61, 62 making them available to the delay-line assembly 49 during the window of opportunity 58 with enough time remaining such that the second clock-signal 26 can settle into a stable state before the end of the clock-retardation period. As a result, by the time the clock-retardation period (e.g. the refresh interval) ends and the next operating period begins, the first and second clock-signals 22, 26 will once again have an offset that comes closer to the target offset.

After one or more clock-retardation periods (e.g. refresh intervals), during each of which the phase error difference between the first and second clock-signals 22, 26 is reduced, the phase error difference between the first and second clock-signals 22, 26 will converge to be so close to the target offset as to ensure proper operation of any signals traversing between functional units clocked by the first and second clock-signals 22, 26. This is because temperature and voltage variation over time on the silicon is far slower than each clock-retardation period. After several retardation periods, the delay setting update can catch up to the delay changes caused by such temperature and voltage variations.

The foregoing example is only one in which the methods and devices described herein are useful. The application of these methods and devices extends beyond memory subsystems to encompass any system in which, as a result of having to communicate with each other, functional units in different clock domains must maintain a particular relationship between clock domains. One other example of such a system is one in which a processor has multiple cores that communicate with each other and that are in different clock domains.

Having described the invention, and a preferred embodiment thereof, what is claimed as new, and secured by Letters Patent is:

The invention claimed is:

1. A method for controlling operation of a system that extends across plural clock domains, wherein said system comprises a first functional unit that is in a first clock domain and a second functional unit that is in a second clock domain, said method comprising:
   driving said first functional unit that comprises a delay-locked loop with a first clock-signal,
   driving said second functional unit with a second clock-signal that has a first temporal offset relative to said first clock-signal,
   retrieving information from said delay-locked loop, and using said information retrieved from said delay-locked loop to control a source of said second clock-signal, and
   dynamically adjusting a temporal offset between said first clock-signal and said second clock-signal, wherein dynamically adjusting said temporal offset between said first clock-signal and said second clock-signal comprises adjusting by an amount that is insufficient to cause at least one of: (1) a glitch in said first or second clock-signal that increases a number of pulses in said first or second clock-signal, or (2) a cycle compression in said first or second clock-signal that compresses a margin beyond a specified value.

2. The method of claim 1, wherein dynamically adjusting said temporal offset between said first clock-signal and said second clock-signal is repeated repetition during each of a plurality of clock-adjustment intervals.

3. The method of claim 1, wherein dynamically adjusting said temporal offset between said first clock-signal and said second clock-signal is completed through repetition during each of a plurality of clock-retardation intervals.

4. The method of claim 3, wherein, after each repetition, a non-zero difference remains between said temporal offset and a target temporal offset.

5. The method of claim 1, wherein dynamically adjusting said temporal offset between said first clock-signal and said second clock-signal to cause a reduction in a difference between a first phase-offset and a target phase-offset comprises causing a reduction that fails to reach said target phase-offset.

6. The method of claim 1, wherein dynamically adjusting said temporal offset between said first clock-signal and said second clock-signal to cause a reduction in a difference between a first phase-offset and a target phase-offset comprises adjusting by an amount that is insufficient to cause a glitch in said second clock-signal.

7. The method of claim 1, wherein dynamically adjusting said temporal offset between said first clock-signal and said second clock-signal to cause a reduction in a difference between a first phase-offset and a target phase-offset comprises adjusting by an amount that is insufficient to cause cycle compression in said second clock-signal that compresses a margin beyond a specified value.

8. An apparatus for data processing, said apparatus comprising:

a controller, wherein said controller comprises a first functional unit, and said first functional unit comprises a delay-locked loop, a second functional unit, a first clock-signal source, a second clock-signal source, and a clock-retardation unit configured to retrieve information from said delay-locked loop, and to use said information retrieved from said delay-locked loop to control said second clock-signal source, wherein said first clock-signal source provides a first clock-signal, wherein said second clock-signal source provides a second clock-signal based on said first clock-signal, wherein said first clock-signal drives said first functional unit, wherein said second clock-signal drives said second functional unit, and wherein said clock-retardation unit is configured to dynamically cause said second clock-signal to have a target temporal offset relative to said first clock-signal, wherein dynamically causing said second clock-signal to have a target temporal offset relative to said first clock-signal comprises adjusting said temporal offset by an amount that is insufficient to cause at least one of: (1) a glitch in said first or second clock-signal that increases a number of pulses in said first or second clock-signal, or (2) a cycle compression in said first or second clock-signal that compresses a margin beyond a specified value.

9. The apparatus of claim 8, wherein said delay-locked loop comprises a first delay line, and said second clock-signal source comprises a second delay line.

10. The apparatus of claim 9, wherein said clock-retardation unit is configured to identify a target phase-offset between said first and second clock-signals and to cause said second delay line to retard said first clock-signal by less than a difference between a target phase-offset and an actual phase-offset between said first and second clock-signals.

11. The apparatus of claim 9, wherein said clock retardation unit is configured to repeatedly cause said second delay line to retard said first clock-signal by selected amounts, wherein said selected amounts are each less than a difference between said target temporal offset between said first and second clock-signals and an actual temporal offset between said first and second clock-signals.

12. The apparatus of claim 9, wherein said first delay line that is identical to said second delay line.

13. The apparatus of claim 9, further comprising a first decoder and a first recirculator, wherein said first decoder is configured for receiving a first delay-line setting, wherein said decoder is configured to generate a one-hot multiplexer select, and wherein said first recirculator is configured to buffer said multiplexer select, thereby preventing said multiplexer select from being applied to said second delay line.

14. The apparatus of claim 13, further comprising a second decoder and a second recirculator, wherein said second decoder is configured for receiving a second delay-line setting, wherein said second decoder is configured to generate a second multiplexer select from said second delay-line setting, and wherein said second recirculator is configured to buffer said second multiplexer select, thereby preventing said second multiplexer select from being applied to said second delay line.

15. The apparatus of claim 14, wherein said second delay-line setting is a function of said first delay-line setting.

16. The apparatus of claim 14, further comprising a third recirculator, wherein said third recirculator is configured for receiving said first delay-line setting from said clock-retardation unit, and to buffer said first delay-line setting from being applied to said second delay line, wherein a fine-control signal comprises said first delay-line setting.

17. The apparatus of claim 16, further comprising a phase interpolator, wherein said phase interpolator is configured to apply a temporal offset to said first clock-signal based on said first and second delay-line settings and on said fine-control setting.

18. The apparatus of claim 13, further comprising a synchronizer configured to load said multiplexer select into storage in response to detection of a first signal and a second signal, wherein said first signal indicates a window of opportunity for adjusting said temporal offset, and wherein said second signal is an update signal indicative of a presence of said first delay-line setting in front of said first recirculator.

19. The apparatus of claim 8, wherein said clock retardation unit is configured to detect occurrence of a clock-retardation interval between two operating intervals and to cause clock retardation only during said clock-retardation interval.

20. The apparatus of claim 8, wherein said clock-retardation unit is configured to detect occurrence of a memory refresh interval between two operating intervals and to cause clock retardation only during said clock-retardation interval.

21. A method for controlling operation of a system that extends across plural clock domains, wherein said system comprises a first functional unit that is in a first clock domain and a second functional unit that is in a second clock domain, said method comprising:

driving said first functional unit that comprises a first delay line with a first clock-signal, driving said second functional unit with a second clock-signal that has a first temporal offset relative to said first clock-signal, buffering a delay-line setting in front of a recirculator, loading said delay-line setting in response to detection of a first signal and a second signal, dynamically adjusting a temporal offset between said first clock-signal and said second clock-signal, wherein dynamically adjusting said temporal offset between said first clock-signal and said second clock-signal comprises adjusting by an amount that is insufficient to cause at least one of: (1) a glitch in said first or second clock-signal that increases a number of pulses in said first or second clock-signal, or (2) a cycle compression in said first or second clock-signal that compresses a margin beyond a specified value, wherein said first signal indicates a window of opportunity for adjusting said temporal offset, and wherein said second signal is an update signal indicative of a presence of said delay-line setting in front of said recirculator.

22. An apparatus for data processing, said apparatus comprising:

a controller, wherein said controller comprises a first functional unit, and said first functional unit comprises a first delay line, a second functional unit, a first clock-signal source, a second clock-signal source that comprises a second delay line, a clock-retardation unit, a recirculator configured to buffer a delay-line setting, and a synchronizer configured to load said delay-line setting in response to detection of a first signal and a second signal, wherein said first clock-signal source provides a first clock-signal, wherein said second clock-signal source provides a second clock-signal based on said first clock-signal, wherein said first clock-signal drives said first functional unit, wherein said second clock-signal drives said second functional unit, wherein said clock-retardation unit is configured to dynamically cause said second clock-signal to have a target temporal offset relative to said first clock-signal, wherein dynamically causing said second clock-signal to have a target temporal offset relative to said first clock-signal comprises adjusting said temporal offset by an amount that is insufficient to cause at least one of: (1) a glitch in said first or second clock-signal that increases a number of pulses in said first or second clock-signal, or (2) a cycle compression in said first or second clock-signal that compresses a margin beyond a specified value, wherein said first signal indicates a window of opportunity for adjusting said temporal offset, and wherein said second signal is an update signal indicative of a presence of said delay-line setting in front of said recirculator.

\* \* \* \* \*